(12) United States Patent
Kothandaraman et al.

(10) Patent No.: US 8,441,281 B2
(45) Date of Patent: May 14, 2013

(54) CURRENT-MODE LOGIC BUFFER WITH ENHANCED OUTPUT SWING

(75) Inventors: Makeshwar Kothandaraman, Bangalore (IN); Pankaj Kumar, Bangalore (IN); Paul K. Hartley, Emmaus, PA (US); John Christopher Kriz, Palmerton, PA (US)

(73) Assignee: LSI Corporation, San Jose, CA (US)

( * ) Notice: Subject to any disclaimer, the term of this patent is extended or adjusted under 35 U.S.C. 154(b) by 135 days.

(21) Appl. No.: 13/165,500

(22) Filed: Jun. 21, 2011

(65) Prior Publication Data

US 2012/0326745 A1 Dec. 27, 2012

(51) Int. Cl.
*H03K 19/003* (2006.01)
*H03K 19/094* (2006.01)
*H03K 19/0175* (2006.01)

(52) U.S. Cl.
USPC .................................. 326/30; 326/82; 326/83

(58) Field of Classification Search ........................ None
See application file for complete search history.

(56) References Cited

U.S. PATENT DOCUMENTS

2006/0158223 A1* 7/2006 Wang et al. ...................... 326/86
2011/0133788 A1* 6/2011 Liu et al. ......................... 327/108

OTHER PUBLICATIONS

Masayuki Mizuno et al., "A GHz MOS Adaptive Pipeline Technique Using MOS Current-Mode Logic," IEEE J. Solid-State Circuits, vol. 31, No. 6, pp. 784-791, Jun. 1996.
Payam Heydari, "Design and Analysis of Low-Voltage Current-Mode Logic Buffers," ISQED '03, Fourth Int'l Symposium on Quality Electronic Design, pp. 293-298, 2003.

* cited by examiner

*Primary Examiner* — Crystal L Hammond
(74) *Attorney, Agent, or Firm* — Otterstedt, Ellenbogen & Kammer, LLP

(57) ABSTRACT

A differential buffer circuit having increased output voltage swing includes a differential input stage including at least first and second transistors, the first and second transistors being operative to receive first and second signals, respectively. The buffer circuit further includes a bias stage connected between the differential input stage and a first voltage source. The bias stage is operative to generate a quiescent current as a function of a third signal supplied to the bias stage. A load circuit is connected between a second voltage source and the differential input stage, first and second differential outputs of the buffer circuit being generated at a junction between the load circuit and the differential input stage. The load circuit includes first and second switching elements coupled with the first and second transistors, respectively. The first switching element is operative to electrically connect the first differential output to the second voltage source when the first transistor is turned off. The second switching element is operative to electrically connect the second differential output to the second voltage source when the second transistor is turned off.

21 Claims, 5 Drawing Sheets

300

CURRENT-MODE LOGIC BUFFER WITH ENHANCED OUTPUT SWING

FIELD OF THE INVENTION

The present invention relates generally to electronic circuits, and more particularly relates to buffer circuits.

BACKGROUND OF THE INVENTION

In contemporary electronic circuits, such as, for example, input/output (IO) buffers, used in various applications, including but not limited to telecommunications, data networking, frequency synthesis, clock and data recovery (CDR), etc., it is often desirable to convey data at relatively high speeds (e.g., 300 megabits per second (Mb/s) or greater). Such high-speed data is often transmitted in a relatively noisy environment. Moreover, the trend to lower operating voltages and power consumption, particularly in mobile electronic devices, only worsens signal-to-noise ratios, thereby further encumbering reliable data transmission efforts.

In order to meet modern high-speed data interfacing specifications, complementary metal-oxide-semiconductor (CMOS) current-mode logic (CML) buffers were introduced (see, e.g., M. Mizuno et al., "A GHz MOS Adaptive Pipeline Technique Using MOS Current-Mode Logic," *IEEE J. Solid-State Circuits*, Vol. 31, No. 6, pp. 784-791, June 1996, the disclosure of which is incorporated by reference herein). CML, sometimes referred to as source-coupled logic (SCL), is based on a differential digital logic architecture and is intended to transmit data at high speeds (e.g., gigabits per second (Gb/s) or greater). FIG. 1 is a schematic diagram illustrating a conventional CML transmission architecture 100 including a source device 102, which may be a transmitter, and a destination device 104, which may be a receiver, coupled together via a differential transmission line 106. Transmission using CML is typically point-to-point, unidirectional, and is often terminated at the destination device 104 using 50-ohm resistors to the positive voltage supply, which may be VDD, on both differential lines 106 as shown.

A CML buffer circuit is generally required to provide an output voltage swing (e.g., Voh to Vol, or Vol to Voh) of about 400 millivolts (mV), for most CML specifications. However, in many applications, particularly those applications requiring a low voltage supply (e.g., 1.0 volt or less), it is challenging to achieve the required output voltage swing and yet still meet other prescribed specifications (e.g., power dissipation, output common-mode (CM), switching speed, etc.). Accordingly, standard CML buffer circuit architectures are impractical and/or undesirable.

SUMMARY OF THE INVENTION

The present invention, in illustrative embodiments thereof, relates to a CML buffer circuit operative to provide enhanced output voltage swing. To accomplish this, aspects of the invention utilize a load circuit which is operative to switch which differential output is pulled up to VDD without adding significant resistance between VDD and the differential outputs of the buffer circuit. Furthermore, a termination circuit is employed which is able to provide a prescribed termination impedance which enables the buffer circuit to be employed in AC coupling applications with only half the quiescent current consumption compared to conventional buffer circuit designs. In this manner, the invention provides a CML buffer circuit which is superior to standard CML buffer circuit architectures.

In accordance with an embodiment of the invention, a differential buffer circuit having increased output voltage swing includes a differential input stage including at least first and second transistors, the first and second transistors being operative to receive first and second signals, respectively. The buffer circuit further includes a bias stage connected between the differential input stage and a first voltage source. The bias stage is operative to generate a quiescent current as a function of a third signal supplied to the bias stage. A load circuit is connected between a second voltage source and the differential input stage, first and second differential outputs of the buffer circuit being generated at a junction between the load circuit and the differential input stage. The load circuit includes first and second switching elements coupled with the first and second transistors, respectively. The first switching element is operative to electrically connect the first differential output to the second voltage source when the first transistor is turned off. The second switching element is operative to electrically connect the second differential output to the second voltage source when the second transistor is turned off.

In accordance with another embodiment of the invention, an electronic system includes at least one integrated circuit, the integrated circuit including at least one differential buffer circuit having increased output voltage swing. The buffer circuit includes a differential input stage including at least first and second transistors, the first and second transistors being operative to receive first and second signals, respectively. The buffer circuit further includes a bias stage connected between the differential input stage and a first voltage source. The bias stage is operative to generate a quiescent current as a function of a third signal supplied to the bias stage. A load circuit is connected between a second voltage source and the differential input stage, first and second differential outputs of the buffer circuit being generated at a junction between the load circuit and the differential input stage. The load circuit includes first and second switching elements coupled with the first and second transistors, respectively. The first switching element is operative to electrically connect the first differential output to the second voltage source when the first transistor is turned off. The second switching element is operative to electrically connect the second differential output to the second voltage source when the second transistor is turned off.

In accordance with yet another embodiment of the invention, the electronic system can be implemented as a communication system including at least one receiver and at least one transmitter operatively coupled with the receiver. At least one of the transmitter and receiver includes at least one differential buffer circuit having increased output voltage swing according to techniques of the present invention set forth herein.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF PREFERRED EMBODIMENTS

The present invention, according to aspects thereof, will be described herein in the context of illustrative CML output buffer circuits adapted to provide enhanced output direct current (DC) swing. It should be understood, however, that the present invention is not limited to these or any other particular circuit arrangements. Rather, the invention is more generally applicable to techniques for improving output voltage swing in a differential buffer circuit while beneficially increasing output common-mode voltage and reducing quiescent current consumption for a differentially terminated CML driver, among other advantages. Moreover, it will become apparent to those skilled in the art given the teachings herein that numerous modifications can be made to the embodiments shown that are within the scope of the present invention. That is, no limitations with respect to the specific embodiments described herein are intended or should be inferred.

Although implementations of the present invention described herein may be implemented using p-channel metal-oxide-semiconductor (PMOS) and n-channel metal-oxide-semiconductor (NMOS) transistor devices, as may be formed using a CMOS fabrication process, it is to be appreciated that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be understood by those skilled in the art. Moreover, although preferred embodiments of the invention are typically fabricated in a silicon wafer, embodiments of the invention can alternatively be fabricated in wafers comprising other materials, including but not limited to Gallium Arsenide (GaAs), Indium Phosphide (InP), etc.

Figure 1:
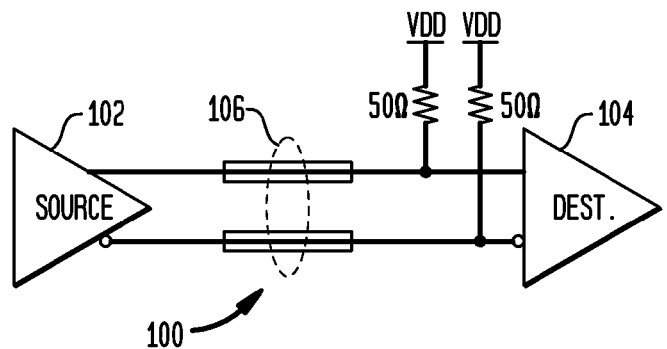
FIG. 1 is a schematic diagram illustrating a conventional CML transmission architecture, including a source and a destination coupled together with a differential transmission line.
Figure 2:
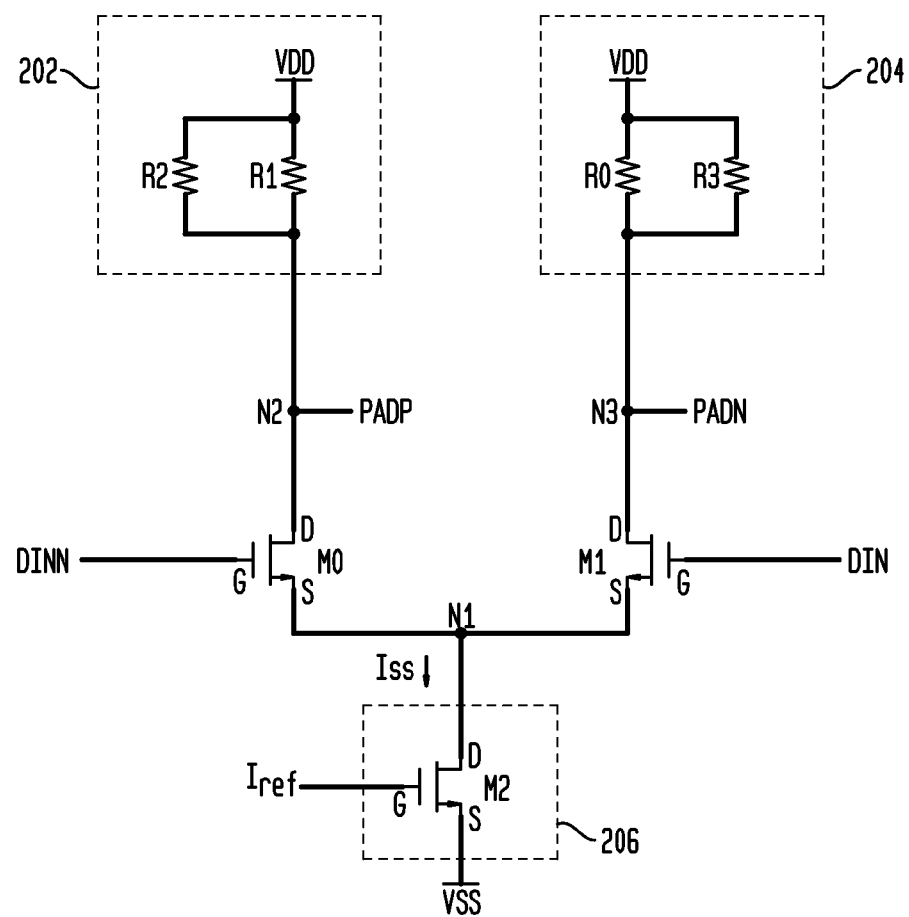
FIG. 2 is a schematic diagram depicting at least a portion of an exemplary CML buffer circuit which can be modified according to techniques of the present invention.

FIG. 2 is a schematic diagram depicting at least a portion of an exemplary CML buffer circuit 200, which can be modified according to techniques of the present invention. As shown in the figure, buffer circuit 200 is implemented using a basic differential architecture comprising a first NMOS transistor device, M0, and a second NMOS transistor device, M1, configured as a differential input stage. Specifically, a drain (D) of NMOS device M0 is preferably connected with a first voltage supply, which may be VDD, via a first pull-up load 202, a gate (G) of M0 preferably forms a first input of the buffer circuit 200, which may be an inverting (−) input, and is adapted to receive a first input signal, DINN, and a source of M0 is coupled to a source of device M1 at node N1, which may be a common tail node. A gate of device M1 preferably forms a second input of the buffer circuit 200, which may be a non-inverting (+) input, and is adapted to receive a second input signal, DIN, which is preferably a logical complement of input signal DINN, and a drain of M1 is preferably connected with VDD via a second pull-up load 204.

It is to be appreciated that, because a metal-oxide-semiconductor (MOS) device is symmetrical in nature, and thus bidirectional, the assignment of source and drain designations in the MOS device is essentially arbitrary. Therefore, the source and drain may be referred to herein generally as first and second source/drain, respectively, where "source/drain" in this context denotes a source or a drain.

First pull-up load 202 preferably comprises a pair of termination resistors, R1 and R2, connected together in parallel between device M0 and VDD. In the context of a transmission system, one of the termination resistors (e.g., R1) preferably represents the source termination which is typically present at the transmitter and the second of the termination resistors (e.g., R2) represents the far end termination which is typically present at the receiver. First terminals of resistors R1 and R2 are connected with the drain of device M0 at node N2, and second terminals of R1 and R2 are adapted for connection with VDD. A first output, which may be a non-inverting output, PADP, of buffer circuit 200, is preferably formed at node N2. Similarly, second pull-up load 204 preferably comprises a pair of termination resistors, R0 and R3, connected together in parallel between device M1 and VDD. More particularly, first terminals of resistors R0 and R3 are connected with the drain of device M1 at node N3, and second terminals of R0 and R3 are adapted for connection with VDD. A second output, which may be an inverting output, PADN, of buffer circuit 200, is preferably formed at node N3. Each of resistors R0, R1, R2 and R3 are preferably selected to be about 50 ohms ($\Omega$) in order to comply with prescribed termination resistance specifications, although the invention is not limited to any specific resistance values. As described above, each resistor should be 50 ohms so that the transmission line is terminated at the source and at the destination. Although some applications require that only the far end be terminated, the cleanest solution is a transmission line that is terminated at both ends. Hence, the effective termination from a DC point of view (assuming the transmission line to be short circuit for DC) is 25 ohms on each of the outputs. Additionally, one or more of resistors R0, R1, R2 and R3 are preferably implemented using polysilicon material, although alternative materials for forming the resistors are similarly contemplated (e.g., metal, p-well, etc.), as will become apparent to those skilled in the art. It is to be understood that alternative pull-up load arrangements are contemplated by the invention, including, but not limited to, the use of one or more active transistor devices (e.g., current minor, etc.).

Buffer circuit 200 further comprises a bias stage 206 including an NMOS transistor device, M2, having a drain connected to node N1, a source adapted for connection to a second voltage source, which may be VSS or ground, and a gate adapted to receive a bias signal, Iref. Alternative bias stage configurations are similarly contemplated by the invention. A quiescent bias current, $I_{SS}$, flowing in buffer circuit 200 will be a function of the bias signal Iref supplied to the buffer circuit. The bias current $I_{SS}$ will be distributed between devices M0 and M1 in the differential input stage as a function of the first and second input signals, DINN and DIN, respectively, supplied to the differential input stage. For example, when DINN is a logic low level (e.g., zero volts) and DIN, being a complement of DINN, is a logic high level (e.g., VDD or about 1.0 volt), device M0 will be turned off and device M1 will be turned on, and thus substantially all of the current $I_{SS}$ will be directed through M1 and pull-up load 204. In this instance, maximum output voltage, Voh, at node N2 will be equal to VDD, and minimum output voltage, Vol, at node N3 will be about equal to VDD–$I_{SS}$×(R0//R3=25 ohms). Conversely, when DINN is a logic high level and DIN is a logic low level, device M1 will be turned off and device M0 will be turned on, and thus substantially all of the current $I_{SS}$ will be directed through M0 and pull-up load 202. In this instance, maximum output voltage Voh at node N3 will be equal to VDD, and minimum output voltage Vol at node N2 will be about equal to VDD–$I_{SS}$×(R1//R2=25 ohms).

As apparent from FIG. 2, the maximum output differential voltage swing, $V_{OS}$, is a function of the resistance of a given pull-up load 202 or 204, depending on which leg (i.e., path) of the buffer circuit is active for a given input signal, and the tail current $I_{SS}$, provided that current switching takes place (i.e., substantially all of the tail current $I_{SS}$ flows through only one of the buffer circuit legs). Here, maximum output voltage swing Vos can be determined as:

$$V_{OS} = Voh - Vol, \quad (1)$$

where Voh is defined as the maximum (i.e., logic high) output voltage level and Vol is defined as the minimum (i.e., logic low) output voltage level, as previously stated.

Clearly, maximum output voltage swing $V_{OS}$ of CML buffer circuit 200 is less than that of a CMOS inverter, thus making this class of buffer circuits well-suited for low-power integrated circuit (IC) applications. Unfortunately, however, this decreased output voltage swing also presents challenges in the buffer circuit design, particularly as the voltage supply of the buffer circuit is reduced (e.g., VDD=1.0 volts or less).

By way of example only and without loss of generality, assume an output voltage swing of 400 mV is desired. In this scenario, Voh will be equal to VDD and Vol will be equal to VDD-400 mV. Using equation (1) above, for an output voltage swing Vos of 400 mV, a tail current Iss of 400 mV/25Ω=16 mA is required. To calculate common-mode voltage, $V_{CM}$, the differential inputs DINN and DIN are set equal to one another. With DINN and DIN equal, devices M0 and M1 will both receive the same gate-to-source voltage, and thus the tail current Iss will be divided equally between the two buffer circuit legs. Thus, the common-mode voltage, $V_{CM}$, in this illustrative scenario can be determined as:

$$V_{CM} = VDD - \frac{I_{SS}}{2} \cdot 25\Omega = VDD - 200 \text{ mV}$$

As can be seen, when VDD is 1.0 volt, $V_{CM}$ will be 800 mV.

As described above, in a scenario that involves a direct DC-coupled connection between a source and a receiver, an equivalent DC circuit of an illustrative interface may be represented by buffer circuit 200. However, a direct DC-coupled connection represents only one class of interfaces that are employed in standard transmission systems. When there is an incompatibility between transmit and receive signaling levels, it is often required to shift the common-mode voltage of the signals using, for example, an AC coupling arrangement (e.g., coupling capacitors). As is well-known by those skilled in the art, AC coupling capacitors essentially block any DC component that may be present in the signal and allow only components of the signal that are above a prescribed frequency to pass. The frequencies of the signal components that are allowed to pass will be a function of the value of the coupling capacitor(s).

Consider, by way of example only, an output buffer which utilizes a resistive source termination to VDD and a receiver which also utilizes a resistive input termination to VDD connected to each other via AC coupling capacitors on true and complementary lines. An equivalent picture of such a configuration may resemble exemplary buffer circuit 300 shown in FIG. 3, which will be described in further detail below. In this circuit configuration, the AC coupling capacitors effectively mask the VDD supply in the receiver from being seen from the driver side. In addition, there may be other scenarios in which differential termination is employed in direct DC-coupled applications. A non-limiting example of this scenario is an application in which a CML output buffer circuit, such as buffer circuit 200 shown in FIG. 2, needs to interface with, for example, an Institute of Electrical and Electronics Engineers (IEEE) Std. 1596.3 low-voltage differential signaling (LVDS) input buffer. (See, e.g., 1596.3-1996-*IEEE Standard for Low-Voltage Differential Signals (LVDS) for Scalable Coherent Interface (SCI)*, 1996 (IEEE Std. 1596.3), the disclosure of which is incorporated by reference herein in its entirety for all purposes.) An IEEE Std. 1596.3 LVDS input buffer only differentially terminates its inputs and does not terminate them to either VDD or GND.

Figure 3:
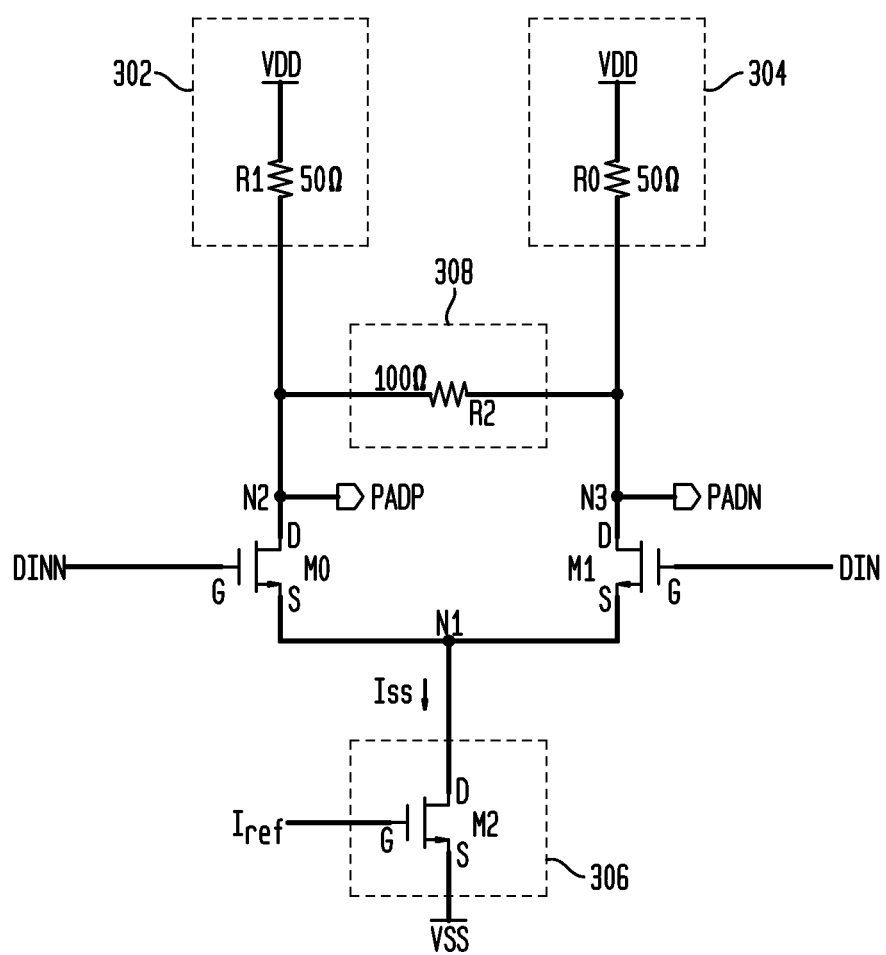
FIG. 3 is a schematic diagram depicting at least a portion of an exemplary CML buffer circuit including differential termination, which can be modified according to techniques of the present invention.

For applications in which buffer circuits are connected together, or with other circuitry, using an AC coupling arrangement (e.g., capacitive coupling), such as, for example, a receiver application, differential termination is preferably employed. With reference now to FIG. 3, a schematic diagram depicts at least a portion of an exemplary CML buffer circuit 300 including differential termination, which can be modified according to techniques of the present invention. Like buffer circuit 200 shown in FIG. 2, buffer circuit 300 is implemented using a basic differential architecture comprising a first NMOS transistor device, M0, and a second NMOS transistor device, M1, configured as a differential input stage. Specifically, a drain of NMOS device M0 is preferably connected with a first voltage supply, which may be VDD, via a first pull-up load 302, a gate of M0 preferably forms a first input of buffer circuit 300, which may be an inverting (−) input, and is adapted to receive a first input signal, DINN, and a source of M0 is coupled to a source of device M1 at node N1, which may be a common tail node. A gate of device M1 preferably forms a second input of buffer circuit 300, which may be a non-inverting (+) input, and is adapted to receive a second input signal, DIN, which is preferably a logical complement of input signal DINN, and a drain of M1 is preferably connected with VDD via a second pull-up load 304.

First pull-up load 302 preferably comprises a termination resistor, R1, connected between device M0 and VDD, although alternative load configurations are contemplated (e.g., active device). A first terminal of resistor R1 is connected with the drain of device M0 at node N2, and a second terminal of R1 is adapted for connection with VDD. A first output, which may be a non-inverting output, PADP, of buffer circuit 300, is preferably formed at node N2. Similarly, second pull-up load 304 preferably comprises a termination resistor, R0, connected between device M1 and VDD, although alternative load configurations are contemplated. More particularly, a first terminal of resistor R0 is connected with the drain of device M1 at node N3, and a second terminal of R0 is adapted for connection with VDD. A second output, which may be an inverting output, PADN, of buffer circuit 300, is preferably formed at node N3. Each of resistors R0 and R1 are preferably selected to be about 50 ohms in order to comply with prescribed termination resistance specifications, although the invention is not limited to any specific resistance values. Additionally, one or more of resistors R0 and R1 are preferably implemented using polysilicon material, although alternative materials for forming the resistors are similarly contemplated (e.g., metal, p-well, etc.), as will become apparent to those skilled in the art.

Buffer circuit 300 further comprises a bias stage 306 including an NMOS transistor device, M2, having a drain connected to node N1, a source adapted for connection to a second voltage source, which may be VSS or ground, and a gate adapted to receive a bias signal, Iref. Alternative bias stage configurations are similarly contemplated by the invention. A quiescent bias current, $I_{SS}$, flowing in buffer circuit 300 will be a function of the bias signal Iref supplied to the buffer circuit. Consistent with buffer circuit 200 shown in FIG. 2, the bias current $I_{SS}$ in buffer circuit 300 will be distributed between devices M0 and M1 in the differential input stage as a function of the first and second input signals, DINN and DIN, respectively, supplied to the differential input stage.

As previously stated, buffer circuit 300 preferably includes a differential termination circuit 308 connected between outputs PADP and PADN of the buffer circuit to thereby enable the buffer circuit to be utilized in AC coupling applications (e.g., a receiver). In this illustrative embodiment, differential termination circuit 308 comprises a resistor, R2, having a first terminal connected with node N2 and a second terminal connected with node N3. Resistor R2, being coupled across the differential output of the buffer circuit 300, serves to provide an equivalent representation of an AC-coupled connection, particularly for applications (e.g., IEEE Std. 1596.3 LVDS) in which the buffer circuit only differentially terminates its inputs and does not terminate them to either VDD or GND. Resistor R2 is preferably selected to be about 100 ohms, although the invention is not limited to any specific resistor value. Nor is the invention limited to the particular differential termination arrangement shown.

By way of example only and without loss of generality, in terms of the DC operation of buffer circuit 300, when input signal DIN is a logic low level (e.g., ground or zero volts) and input signal DINN, being a logical complement of DIN, is a logic high level (e.g., VDD or 1.0 volts), device M0 will be turned on and device M1 will be turned off. With device M1 turned off, output PADN (node N3) will be pulled to VDD through resistor R0 and output PADP will be pulled to VSS through devices M0 and M2. Substantially all of the tail current Iss will flow through device M0. However, because of the termination resistor R2, some portion of the current Iss will flow through an electrical path to VDD established by the series combination of resistors R0 and R2. Based on the exemplary resistance values shown, the resistance in a first signal path between node N2 and VDD through pull-up load 302 is 50 ohms; the resistance in a second signal path between node N2 and VDD through pull-up load 304 and termination element 308 is 150 ohms. Therefore, about 75% of the current Iss will be distributed through the first signal path and about 25% of Iss will flow through the second signal path.

Similarly, when input signal DIN is a logic high level (e.g., about 1.0 volts) and input signal DINN, being a logical complement of DIN, is a logic low level (e.g., about 0 volts), device M0 will be turned off and device M1 will be turned on. With device M0 turned off, output PADP (node N2) will be pulled to VDD through resistor R1, and output PADN will be pulled to VSS through devices M1 and M2. Substantially all of the tail current Iss will flow through device M1. However, as previously explained, because of the termination resistor R2, some portion of the current Iss will flow through an electrical path to VDD established by the series combination of resistors R1 and R2. Based on the exemplary resistance values shown, the resistance in a first signal path between node N3 and VDD through pull-up load 304 is 50 ohms; the resistance in a second signal path between node N3 and VDD through pull-up load 302 and termination element 308 is 150 ohms. Therefore, about 75% of the current Iss will be distributed through the first signal path and about 25% will be distributed through the second signal path.

As a result of the current flowing through the path established by termination resistor R2, there will be a voltage drop present at the high level output node, either PADP or PADN, depending on the polarity of the input signals DIN and DINN applied to the buffer circuit 300, which undesirably reduces the Voh level provided by the buffer circuit. For example, assuming an output voltage swing of 400 mV is desired, the required tail current Iss will be about 16 mA. When input signal DIN is a logic high level and DINN is a logic low level, about 75% of the current Iss will flow through resistor R0 and about 25% of Iss will flow through resistors R1 and R2. Therefore, the voltage drop across resistor R1 will be about equal to (0.25)(16 mA)(50Ω)=200 mV. Similarly, there will be a 200 mV drop across resistor R0 when DIN is low and DINN is high. This voltage drop will lower the maximum output voltage Voh to about 800 mV. In calculating the minimum output voltage Vol under these exemplary conditions, the voltage drop across resistor R0 will be about equal to (0.75)(16 mA)(50Ω)=600 mV. This decreases Vol to about 400 mV. The common-mode voltage $V_{CM}$ in this scenario will be shifted by about 200 mV, compared to buffer circuit 200 shown in FIG. 2, to about 600 mV. This places a significant constraint on the maximum output voltage swing across differential outputs PADP and PADN, and additionally creates a severe headroom issue. Furthermore, there is a high likelihood that input devices M0 and M1 will come out of saturation, thereby undesirably impacting the performance of buffer circuit 300.

Figure 4:
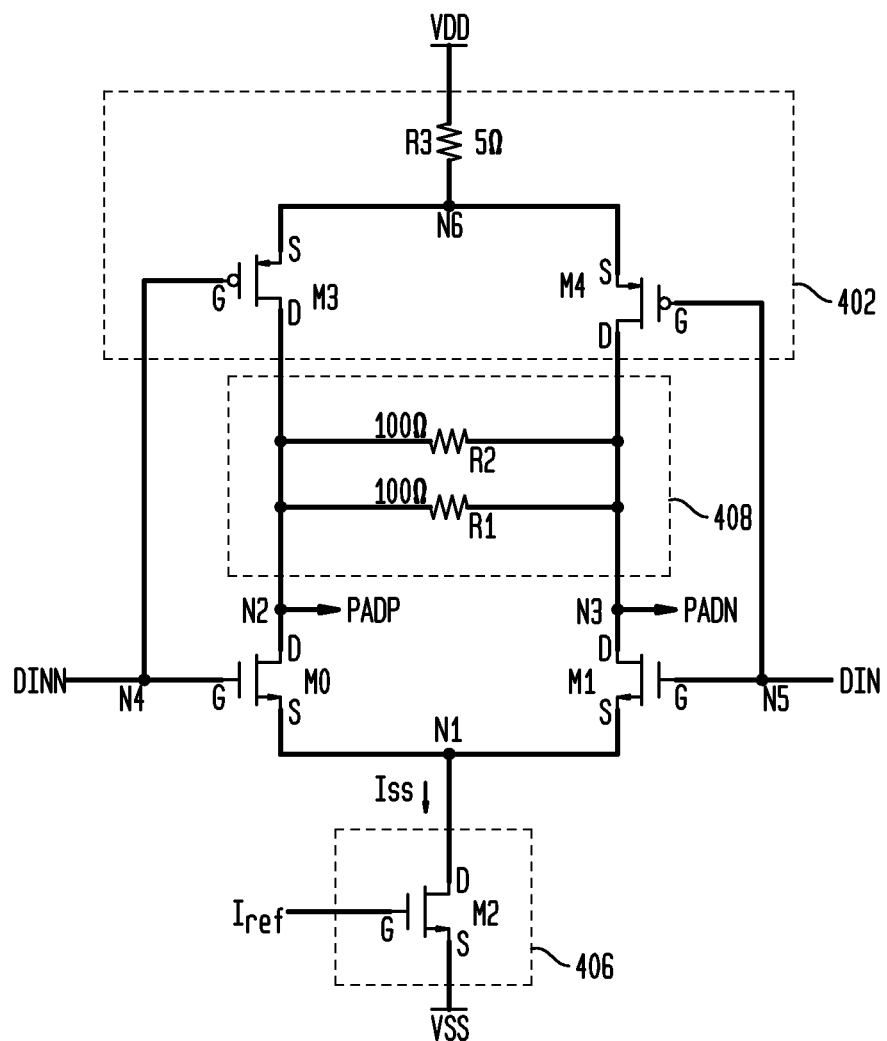
FIG. 4 is a schematic diagram depicting at least a portion of an exemplary CML buffer circuit with enhanced output voltage swing, according to an embodiment of the present invention.

In order to address at least the above-noted issues, FIG. 4 is a schematic diagram depicting at least a portion of an exemplary CML buffer circuit 400 with enhanced output swing, according to an embodiment of the present invention. Buffer circuit 400 is implemented using a differential architecture comprising a first NMOS transistor device, M0, and a second NMOS transistor device, M1, configured as a differential input stage. A drain of device M0 is preferably connected with a first voltage supply, which may be VDD, via a load circuit 402, which may be a pull-up load circuit in this embodiment, at node N2, a gate of M0 preferably forms a first input of the buffer circuit 400 at node N4, which may be an inverting (−) input, and is adapted to receive a first input signal, DINN, and a source of M0 is coupled to a source of device M1 at node N1, which may be a common tail node. A gate of device M1 preferably forms a second input of the buffer circuit 400 at node N5, which may be a non-inverting (+) input, and is adapted to receive a second input signal, DIN, which is preferably a logical complement of input signal DINN, and a drain of M1 is preferably connected with VDD via the load circuit 402 at node N3. A first differential output of the buffer circuit 400, which may be a non-inverting output, PADP, is preferably formed at node N2, and a second differential output of the buffer circuit, which may be an inverting output, PADN, is formed at node N3.

Buffer circuit 400 further comprises a bias stage 406 including an NMOS transistor device, M2, having a drain connected to node N1, a source adapted for connection to a second voltage source, which may be VSS or ground, and a gate adapted to receive a bias signal, Iref. Alternative bias stage configurations are similarly contemplated by the invention. A quiescent bias current, $I_{SS}$, flowing in buffer circuit 400 will be a function of the bias signal Iref supplied to the buffer circuit and/or a size (e.g., channel width and/or channel length) of device M2. The bias current $I_{SS}$ will be distributed between devices M0 and M1 in the differential input stage as a function of the first and second input signals, DINN and DIN, respectively, supplied to the differential input stage. For example, when DINN is a logic low level (e.g., zero volts) and DIN, being a complement of DINN, is a logic high level (e.g., VDD or about 1.0 volt), device M0 will be turned off and device M1 will be turned on, and thus substantially all of the current $I_{SS}$ will be directed through M1. Conversely, when DINN is a logic high level and DIN is a logic low level, device M1 will be turned off and device M0 will be turned on, and thus substantially all of the current $I_{SS}$ will be directed through M0.

A differential termination circuit 408 is preferably connected between outputs PADP and PADN of the buffer circuit 400 to thereby enable the buffer circuit to be utilized in AC coupling applications (e.g., a receiver). In this illustrative embodiment, differential termination circuit 408 comprises a pair of resistors, R1 and R2, coupled in parallel with one another across the differential outputs PADP and PADN of buffer circuit 400. Specifically, first terminals of resistors R1 and R2 are connected with N2 and second terminals of R1 and R2 are connected with node N3. Differential termination circuit 408, being coupled across the differential output of the buffer circuit 400, serves to provide an equivalent representation of an AC-coupled connection, particularly for applications (e.g., IEEE Std. 1596.3 LVDS) in which the buffer circuit only differentially terminates its inputs and does not terminate them to either VDD or GND. Differential termination circuit 408 may also serve to prevent a differential transmission line, which may be connected with the buffer circuit outputs, from becoming undefined. Resistors R1 and R2 are preferably selected to be about 100 ohms, although the invention is not limited to any specific resistor value(s). Nor is the invention limited to the particular differential termination circuit arrangement shown.

Load circuit 402 is preferably connected between VDD and the differential outputs PADP and PADN of the buffer circuit 400. Specifically, load circuit 402 includes a resistor, R3, and first and second switching elements, which may be implemented as PMOS transistor devices, M3 and M4, respectively, although alternative switching elements may be used (e.g., NMOS transistor devices) and are contemplated by the invention, as will become apparent to those skilled in the art given the teachings herein. Resistor R3 preferably comprises polysilicon material, although alternative materials may be employed (e.g., p-well, metal, etc.). A first terminal of resistor R3 is adapted for connection with VDD, a second terminal of R3 is connected with sources of devices M3 and M4 at node N6, a gate of M3 is connected with a gate of device M0 at node N4, a gate of M4 is connected with a gate of device M1 at node N5, a drain of M3 is connected with buffer output PADP at node N2, and a drain of M4 is connected with buffer output PADN at node N3.

Hence, the load circuit 402 is preferably configured in such a manner that when an input device (e.g., M0 or M1) to which a given switching element (e.g., M3 or M4, respectively) is connected is turned off (e.g., by a logic low input signal DINN), the given switching element is turned on to thereby pull the corresponding output node high (e.g., to VDD). Conversely, when an input device (e.g., M0) to which a given switching element (e.g., M3) is connected is turned on, such as, for example, by a logic high input signal DINN, the given switching element is turned off and the switching element (e.g., M4) connected with the complementary buffer circuit output node (e.g., PADN) is turned on to thereby pull the corresponding output node high.

Devices M3 and M4, which function primarily as switches, are preferably sized (e.g., by selection of device channel width and/or channel length) to have a substantially low resistance (i.e., on-resistance) between their respective drain-to-source regions ($R_{Ds}$). By doing so, a voltage drop across devices M3 and M4 is thereby minimized. Resistor R3 is also selected to have a substantially low resistance (e.g., about five ohms) and preferably functions, at least in part, to preserve an output common-mode voltage of the buffer circuit 400 during switching. With resistor R3 and the respective drain-to-source resistances of devices M3 and M4 kept substantially low, the maximum output voltage Voh of buffer circuit 400 can be maintained substantially near VDD.

By way of example only and without loss of generality, assuming an output swing of about 400 mV is desired, as is typically specified for a CML buffer circuit, and given the illustrative values shown for resistors R1 and R2 in termination circuit 408 (e.g., 100 ohms each), the tail current Iss is preferably selected to be about 8 mA (i.e., Iss=400 mV/[R1//R2]), which, advantageously, is half the current used in buffer circuits 200 and 300 shown in FIGS. 2 and 3, respectively. With resistor R3 selected to be about 5 ohms, a current of 8 mA flowing through R3 will only produce a voltage drop of about 40 mV, which is not significant. Likewise, the voltage drop across the source-drain regions of devices M3 and M4 will be about 50 mV. Thus, the maximum output voltage level of the buffer circuit 400 will be about VDD−90 mV, which is substantially close to VDD. Thus, the inventive scheme, in accordance with an embodiment thereof, presents a trade-off between IC area and how close Voh is desired to be near VDD, reducing the tail current Iss by a factor of two in the process.

With maximum output voltage Voh about equal to VDD, minimum output voltage Vol will be about equal to VDD−400 mV, or Vol≈600 mV for VDD=1.0V. Output common-mode of buffer circuit 400 in this illustrative scenario will increase compared to buffer circuit 300 shown in FIG. 3 and will be about equal to VDD−200 mV, thus reducing the likelihood that input device M0 and M1 will come out of saturation. In actuality, Voh will be about equal to VDD−90 mV, Vol will be about equal to VDD−490 mV and the output common mode voltage $V_{CM}$ of the circuit will be about VDD−290 mV, compared to conventional buffer circuits which are typically about VDD−400 mV. It is to be appreciated that a 110 mV increase in common mode voltage represents a significant improvement in operational headroom for devices M0, M1 and M2, particularly in low supply voltage applications (e.g., VDD about 1.0V or less). Furthermore, DC swing between the differential outputs PADP and PADN of buffer circuit 400 can be beneficially controlled by proper selection of the resistance in termination circuit 408 and selection of the tail current Iss. As previously stated, current Iss can be controlled as a function of a voltage level of bias signal Iref and/or a size of device M2 in bias stage 406.

Although buffer circuit 400 is shown as comprising NMOS transistors M0 and M1 in the differential input stage, an NMOS transistor M2 in the bias stage 406, and PMOS transistors M3 and M4 in load circuit 402, it is to be understood that the invention is not limited to this configuration. For example, each of the transistor devices in buffer circuit 400 may be substituted with corresponding transistors of an opposite polarity type, as depicted in FIG. 5.

Figure 5:
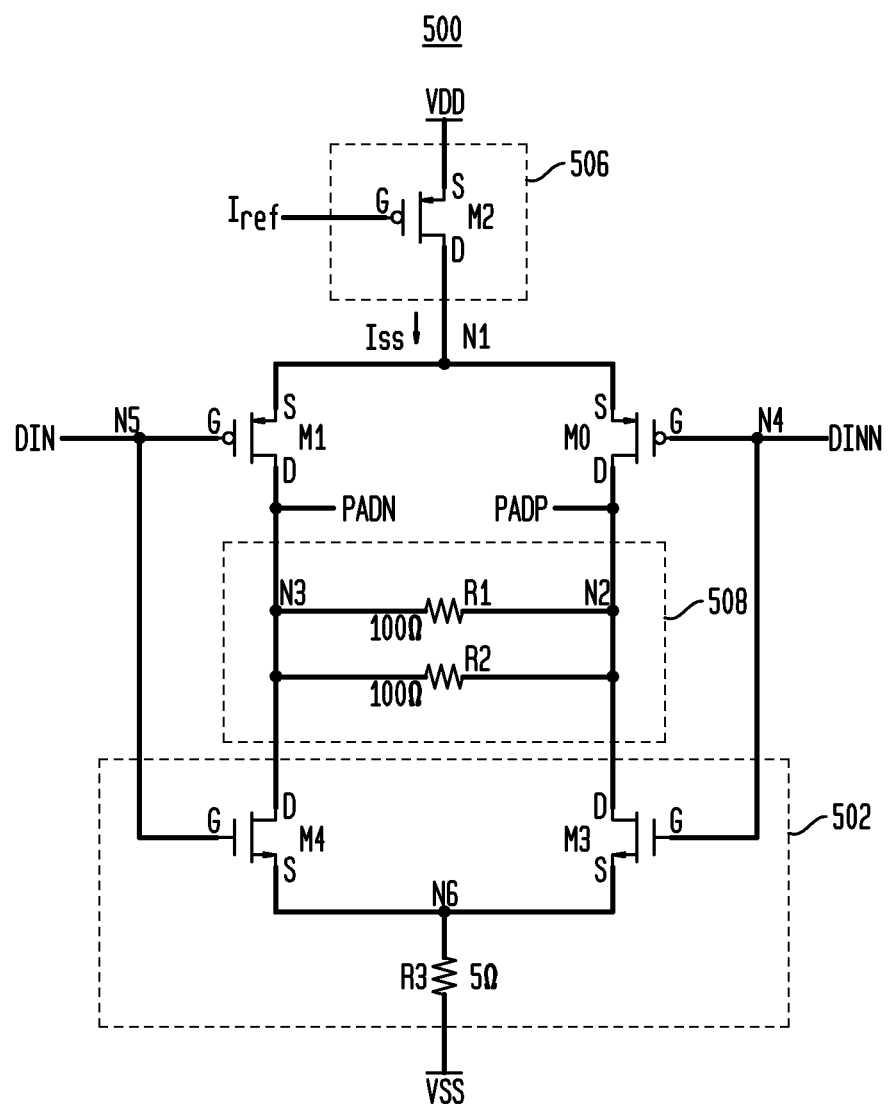
FIG. 5 is a schematic diagram depicting at least a portion of an exemplary CML buffer circuit with enhanced output voltage swing, according to another embodiment of the present invention.

With reference now to FIG. 5, at least a portion of an exemplary CML buffer circuit 500 is shown, according to another embodiment of the invention. Buffer circuit 500 is implemented using a differential architecture comprising a first PMOS transistor device, M0, and a second PMOS transistor device, M1, configured as a differential input stage. A drain of device M0 is preferably connected with a first voltage supply, which may be VSS or ground, via a load circuit 502, which may be a pull-down load circuit in this embodiment, at node N2, a gate of M0 preferably forms a first input of the buffer circuit 500 at node N4, which may be an inverting (−) input, and is adapted to receive a first input signal, DINN, and a source of M0 is coupled to a source of device M1 at node N1, which may be a common tail node. A gate of device M1 preferably forms a second input of the buffer circuit 500 at node N5, which may be a non-inverting (+) input, and is adapted to receive a second input signal, DIN, which is preferably a logical complement of input signal DINN, and a drain of M1 is preferably connected with VSS via the load circuit 502 at node N3. A first differential output of the buffer circuit 500, which may be a non-inverting output, PADP, is preferably formed at node N2, and a second differential output of the buffer circuit, which may be an inverting output, PADN, is formed at node N3.

Buffer circuit 500 further comprises a bias stage 506 including a PMOS transistor device, M2, having a drain connected to node N1, a source adapted for connection to a second voltage source, which may be VDD, and a gate adapted to receive a bias signal, Iref. Alternative bias stage configurations are similarly contemplated by the invention. A quiescent bias current, $I_{SS}$, flowing in buffer circuit 500 will be a function of the bias signal Iref supplied to the buffer circuit and/or a size of device M2. The bias current $I_{SS}$ will be distributed between devices M0 and M1 in the differential input stage as a function of the first and second input signals, DINN and DIN, respectively, supplied to the differential input stage.

A differential termination circuit 508 is preferably connected between outputs PADP and PADN of the buffer circuit 500 to thereby enable the buffer circuit to be utilized in AC coupling applications (e.g., a receiver). In this illustrative embodiment, differential termination circuit 508 comprises a pair of resistors, R1 and R2, coupled in parallel with one another across the differential outputs PADP and PADN of buffer circuit 500. Specifically, first terminals of resistors R1 and R2 are connected with N2 and second terminals of R1 and R2 are connected with node N3. Differential termination circuit 508, being coupled across the differential output of the buffer circuit 500, preferably serves to provide an equivalent representation of an AC-coupled connection, particularly for applications in which the buffer circuit only differentially terminates its inputs and does not terminate them to either VDD or GND. Differential termination circuit 508 may also serve to prevent a differential transmission line, which may be connected with the buffer circuit outputs, from becoming undefined. Resistors R1 and R2 are preferably selected to be about 100 ohms, although the invention is not limited to any specific resistor value. Nor is the invention limited to the particular differential termination circuit arrangement shown.

Load circuit 502 is preferably connected between VSS and the differential outputs PADP and PADN of the buffer circuit 500. Specifically, load circuit 502 includes a resistor, R3, and first and second switching elements, which may be implemented as NMOS transistor devices, M3 and M4, respectively, although alternative switching elements may be used, as will become apparent to those skilled in the art given the teachings herein. Resistor R3 preferably comprises polysilicon material, although alternative materials may be employed (e.g., p-well, metal, etc.). A first terminal of resistor R3 is adapted for connection with VSS, a second terminal of R3 is connected with sources of devices M3 and M4 at node N6, a gate of M3 is connected with a gate of device M0 at node N4, a gate of M4 is connected with a gate of device M1 at node N5, a drain of M3 is connected with buffer output PADP at node N2, and a drain of M4 is connected with buffer output PADN at node N3.

Load circuit 502 is preferably configured in such a manner that when an input device (e.g., M0 or MD to which a given switching element (e.g., M3 or M4, respectively) is connected is turned off (e.g., by a logic high input signal DINN), the given switching element is turned on to thereby pull the corresponding output node low (e.g., to VSS). Conversely, when an input device (e.g., M0) to which a given switching element (e.g., M3) is connected is turned on, such as, for example, by a logic low input signal DINN, the given switching element is turned off and the switching element (e.g., M4) connected with the complementary buffer circuit output node (e.g., PADN) is turned on to thereby pull the corresponding output node low.

As in buffer circuit 400 shown in FIG. 4, devices M3 and M4 in buffer circuit 500 function primarily as switches and are therefore preferably sized to have a substantially low resistance between their respective drain-to-source regions ($R_{DS}$). By doing so, a voltage drop across devices M3 and M4 is thereby minimized. Resistor R3 is also selected to have a substantially low resistance (e.g., about five ohms) and preferably functions, at least in part, to preserve an output common-mode voltage of the buffer circuit 500 during switching. With resistor R3 and the respective drain-to-source resistances of devices M3 and M4 kept substantially low, the minimum output voltage Vol of buffer circuit 500 can be maintained substantially near VSS.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in FIGS. 1 through 5, or portions thereof, may be part of an integrated circuit. Integrated circuits so manufactured are considered part of this invention.

An integrated circuit in accordance with the present invention can be employed in essentially any application and/or electronic system in which a buffer circuit is utilized. Suitable systems for implementing techniques of the invention may include, but are not limited to, personal computers, communication systems, electronic instruments (e.g., automated test equipment (ATE)), interface networks, high-speed memory interfaces (e.g., DDR3, DDR4), etc. Systems incorporating such integrated circuits are considered part of this invention.

Figure 6:
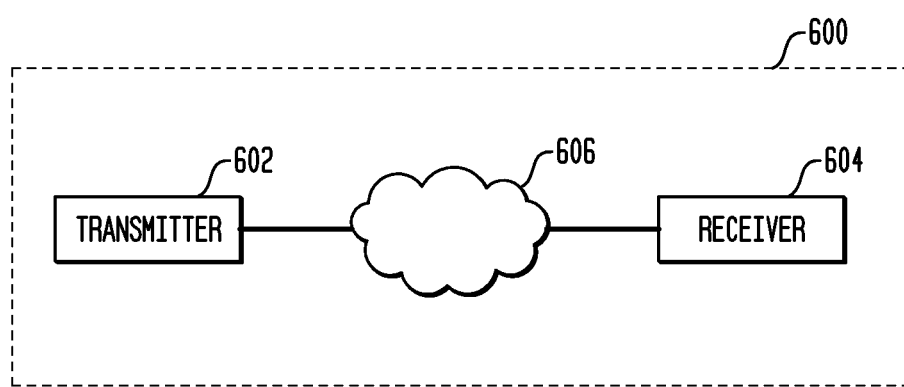
FIG. 6 is a block diagram depicting at least a portion of an electronic system, according to an embodiment of the present invention.

For example, FIG. 6 depicts at least a portion of an exemplary communication system 600 which includes at least one receiver 602 operatively coupled with at least transmitter 604.

Receiver 602 and transmitter 604 are preferably operatively coupled with one another via a communication channel 606, which may be wired (e.g., cable, optical fiber, etc.) or wireless (e.g., infrared, microwave, radio frequency (RF), etc.). At least one of the receiver 602 and the transmitter 604 includes one or more differential buffer circuits having increased output voltage swing, formed in accordance with an embodiment of the invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A differential buffer circuit having increased output voltage swing, comprising:
    a differential input stage including at least first and second transistors, the first and second transistors being operative to receive first and second signals, respectively;
    a bias stage connected between the differential input stage and a first voltage source, the bias stage being operative to generate a quiescent current as a function of a third signal supplied to the bias stage; and
    a load circuit connected between a second voltage source and the differential input stage, first and second differential outputs of the buffer circuit being generated at a junction between the load circuit and the differential input stage, the load circuit including first and second switching elements coupled with the first and second transistors, respectively, the first switching element being operative to electrically connect the first differential output to the second voltage source when the first transistor is turned off as a function of only the first signal, the second switching element being operative to electrically connect the second differential output to the second voltage source when the second transistor is turned off as a function of only the second signal.

2. The buffer circuit of claim 1, further comprising a termination circuit connected across the differential outputs of the buffer circuit.

3. The buffer circuit of claim 2, wherein the termination circuit comprises at least one resistor having a first terminal connected with the first differential output and a second terminal connected with the second differential output.

4. The buffer circuit of claim 1, wherein the differential input stage comprises:
    a first NMOS transistor device having a first source/drain connected with the first switching element and forming the first differential output of the buffer circuit, a gate operative to receive the first signal, and a second source/drain connected with the bias stage; and
    a second NMOS transistor device having a first source/drain connected with the second switching element and forming the second differential output of the buffer circuit, a gate operative to receive the second signal, and a second source/drain connected with the second source/drain of the first NMOS transistor device.

5. The buffer circuit of claim 1, wherein the load circuit comprises:
    a resistor having a first terminal adapted for connection with the second voltage source;
    a first PMOS transistor device having a first source/drain connected with a second terminal of the resistor, a gate operative to receive the first signal, and a second source/drain connected with the input differential stage at the first differential output; and
    a second PMOS transistor device having a first source/drain connected with the second terminal of the resistor, a gate operative to receive the second signal, and a second source/drain connected with the input differential stage at the second differential output.

6. The buffer circuit of claim 1, wherein the bias stage comprises an NMOS transistor device having a first source/drain adapted for connection with the first voltage source, a gate adapted to receive the third signal, and a second source/drain connected with the differential input stage, an amount of quiescent current being a function of at least one of the third signal and a channel size of the NMOS transistor device.

7. The buffer circuit of claim 1, wherein the load circuit comprises a resistor element connected between the first and second switching elements and the second voltage source, the resistor element having a resistance value selected to provide a prescribed output common-mode voltage of the buffer circuit during switching.

8. The buffer circuit of claim 1, wherein the differential input stage comprises:
    a first PMOS transistor device having a first source/drain connected with the first switching element and forming the first differential output of the buffer circuit, a gate operative to receive the first signal, and a second source/drain connected with the bias stage; and
    a second PMOS transistor device having a first source/drain connected with the second switching element and forming the second differential output of the buffer circuit, a gate operative to receive the second signal, and a second source/drain connected with the second source/drain of the first PMOS transistor device.

9. The buffer circuit of claim 1, wherein the load circuit comprises:
    a resistor having a first terminal adapted for connection with the second voltage source;
    a first NMOS transistor device having a first source/drain connected with a second terminal of the resistor, a gate operative to receive the first signal, and a second source/drain connected with the input differential stage at the first differential output; and
    a second NMOS transistor device having a first source/drain connected with the second terminal of the resistor, a gate operative to receive the second signal, and a second source/drain connected with the input differential stage at the second differential output.

10. The buffer circuit of claim 1, wherein the bias stage comprises a PMOS transistor device having a first source/drain adapted for connection with the first voltage source, a gate adapted to receive the third signal, and a second source/drain connected with the differential input stage, an amount of quiescent current being a function of at least one of the third signal and a channel size of the PMOS transistor device.

11. The buffer circuit of claim 1, wherein the first voltage source is ground and the second voltage source is VDD.

12. An integrated circuit, comprising:
    at least one differential buffer circuit having increased output voltage swing, the at least one buffer circuit comprising:
        a differential input stage including at least first and second transistors, the first and second transistors being operative to receive first and second signals, respectively;

a bias stage connected between the differential input stage and a first voltage source, the bias stage being operative to generate a quiescent current as a function of a third signal supplied to the bias stage; and a load circuit connected between a second voltage source and the differential input stage, first and second differential outputs of the buffer circuit being generated at a junction between the load circuit and the differential input stage, the load circuit including first and second switching elements coupled with the first and second transistors, respectively, the first switching element being operative to electrically connect the first differential output to the second voltage source when the first transistor is turned off as a function of only the first signal, the second switching element being operative to electrically connect the second differential output to the second voltage source when the second transistor is turned off as a function of only the second signal.

13. The integrated circuit of claim 12, further comprising a termination circuit connected across the differential outputs of the buffer circuit.

14. The integrated circuit of claim 12, wherein the differential input stage comprises:
a first NMOS transistor device having a first source/drain connected with the first switching element and forming the first differential output of the buffer circuit, a gate operative to receive the first signal, and a second source/drain connected with the bias stage; and
a second NMOS transistor device having a first source/drain connected with the second switching element and forming the second differential output of the buffer circuit, a gate operative to receive the second signal, and a second source/drain connected with the second source/drain of the first NMOS transistor device.

15. The integrated circuit of claim 12, wherein the load circuit comprises:
a resistor having a first terminal adapted for connection with the second voltage source;
a first PMOS transistor device having a first source/drain connected with a second terminal of the resistor, a gate operative to receive the first signal, and a second source/drain connected with the input differential stage at the first differential output; and
a second PMOS transistor device having a first source/drain connected with the second terminal of the resistor, a gate operative to receive the second signal, and a second source/drain connected with the input differential stage at the second differential output.

16. The integrated circuit of claim 12, wherein the load circuit comprises a resistor element connected between the first and second switching elements and the second voltage source, the resistor element having a resistance value selected to provide a prescribed output common-mode voltage of the buffer circuit during switching.

17. The integrated circuit of claim 12, wherein the differential input stage comprises:
a first PMOS transistor device having a first source/drain connected with the first switching element and forming the first differential output of the buffer circuit, a gate operative to receive the first signal, and a second source/drain connected with the bias stage; and
a second PMOS transistor device having a first source/drain connected with the second switching element and forming the second differential output of the buffer circuit, a gate operative to receive the second signal, and a second source/drain connected with the second source/drain of the first PMOS transistor device.

18. The integrated circuit of claim 12, wherein the load circuit comprises:
a resistor having a first terminal adapted for connection with the second voltage source;
a first NMOS transistor device having a first source/drain connected with a second terminal of the resistor, a gate operative to receive the first signal, and a second source/drain connected with the input differential stage at the first differential output; and
a second NMOS transistor device having a first source/drain connected with the second terminal of the resistor, a gate operative to receive the second signal, and a second source/drain connected with the input differential stage at the second differential output.

19. The integrated circuit of claim 12, wherein the bias stage comprises an NMOS transistor device having a first source/drain adapted for connection with the first voltage source, a gate adapted to receive the third signal, and a second source/drain connected with the differential input stage, an amount of quiescent current being a function of at least one of the third signal and a channel size of the NMOS transistor device.

20. An electronic system, comprising:
at least one integrated circuit, the at least one integrated circuit including at least one differential buffer circuit having increased output voltage swing, the at least one buffer circuit comprising:
a differential input stage including at least first and second transistors, the first and second transistors being operative to receive first and second signals, respectively;
a bias stage connected between the differential input stage and a first voltage source, the bias stage being operative to generate a quiescent current as a function of a third signal supplied to the bias stage; and
a load circuit connected between a second voltage source and the differential input stage, first and second differential outputs of the buffer circuit being generated at a junction between the load circuit and the differential input stage, the load circuit including first and second switching elements coupled with the first and second transistors, respectively, the first switching element being operative to electrically connect the first differential output to the second voltage source when the first transistor is turned off as a function of only the first signal, the second switching element being operative to electrically connect the second differential output to the second voltage source when the second transistor is turned off as a function of only the second signal.

21. A communication system, comprising:
at least one receiver; and
at least one transmitter operatively coupled with the receiver, at least one of the transmitter and the receiver including at least one differential buffer circuit having increased output voltage swing, the at least one buffer circuit comprising:
a differential input stage including at least first and second transistors, the first and second transistors being operative to receive first and second signals, respectively;
a bias stage connected between the differential input stage and a first voltage source, the bias stage being operative to generate a quiescent current as a function of a third signal supplied to the bias stage; and a load circuit connected between a second voltage source and the differential input stage, first and second differential outputs of the buffer circuit being generated at a junction between the load circuit and the differential input stage, the load circuit including first and second switching elements coupled with the first and second transistors, respectively, the first switching element being operative to electrically connect the first differential output to the second voltage source when the first transistor is turned off as a function of only the first signal, the second switching element being operative to electrically connect the second differential output to the second voltage source when the second transistor is turned off as a function of only the second signal.

* * * * *